(12) United States Patent  
Pesci (10) Patent No.: US 7,420,391 B2
(45) Date of Patent: Sep. 2, 2008

(54) CIRCUIT ARRANGEMENT AND METHOD FOR OPERATING A CIRCUIT ARRANGEMENT

(75) Inventor: Alessandro Pesci, Graz (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/612,316

(22) Filed: Dec. 18, 2006

(65) Prior Publication Data

US 2007/0146033 A1 Jun. 28, 2007

(30) Foreign Application Priority Data

Dec. 16, 2005 (DE) ............. 10 2005 060 394

(51) Int. Cl.
*H03K 19/173* (2006.01)
(52) U.S. Cl. .......................... 326/46; 326/93
(58) Field of Classification Search ............. 326/37, 326/38, 46, 93–98
See application file for complete search history.

(56) References Cited

U.S. PATENT DOCUMENTS

| 5,498,988 | A | | 3/1996 | Reyes et al. | |
|---|---|---|---|---|---|
| 5,818,274 | A | * | 10/1998 | Lombreschi et al. | 327/217 |
| 6,466,520 | B1 | * | 10/2002 | Speyer et al. | 368/118 |
| 6,545,508 | B2 | * | 4/2003 | Senba | 327/20 |
| 6,630,853 | B1 | | 10/2003 | Hamada et al. | |
| 7,042,250 | B1 | * | 5/2006 | Ghosh et al. | 326/93 |
| 2003/0006806 | A1 | | 1/2003 | Elappuparackal | |
| 2004/0246810 | A1 | | 12/2004 | Dike et al. | |

FOREIGN PATENT DOCUMENTS

JP          1-286609          11/1989

* cited by examiner

*Primary Examiner*—Don P Le
(74) *Attorney, Agent, or Firm*—Dickstein, Shapiro, LLP.

(57) ABSTRACT

A circuit arrangement including a data input for applying a data signal, a set input for applying a set signal and an output for providing an output state. The output is coupled to the data input and to the set input in such a manner that the output state provided is set only when an input state of the data signal and the output state differ from one another and the set signal changes to a prescribed state.

22 Claims, 6 Drawing Sheets

CIRCUIT ARRANGEMENT AND METHOD FOR OPERATING A CIRCUIT ARRANGEMENT

FIELD OF THE INVENTION

The invention relates to a circuit arrangement for buffering an input signal which is applied to the input and to a method for operating a circuit arrangement for buffering an input signal which is applied to the input.

BACKGROUND

Buffers are frequently used in the form of so-called flip-flops in digital circuits. A flip-flop is a clocked memory element having a multiplicity of transistors, which provides a state of an input signal, which is applied to the input, at the output when an edge of a set signal is applied to a set input, which is also referred to as setting. Clocking is usually effected using a periodic clock signal.

If, in the case of the flip-flop, the state of the input signal, which is applied to the input, does not change over a relatively long period of time, the state of an output signal, which is provided at the output, also remains unchanged. However, the state of the signal, which is provided at the output, is reset with each clock pulse. Each setting operation is internally associated with a considerable amount of power consumption since the setting operation is associated with flip-flop-internal switching operations of transistors which the flip-flop comprises.

DESCRIPTION OF THE INVENTION

Figure 1:
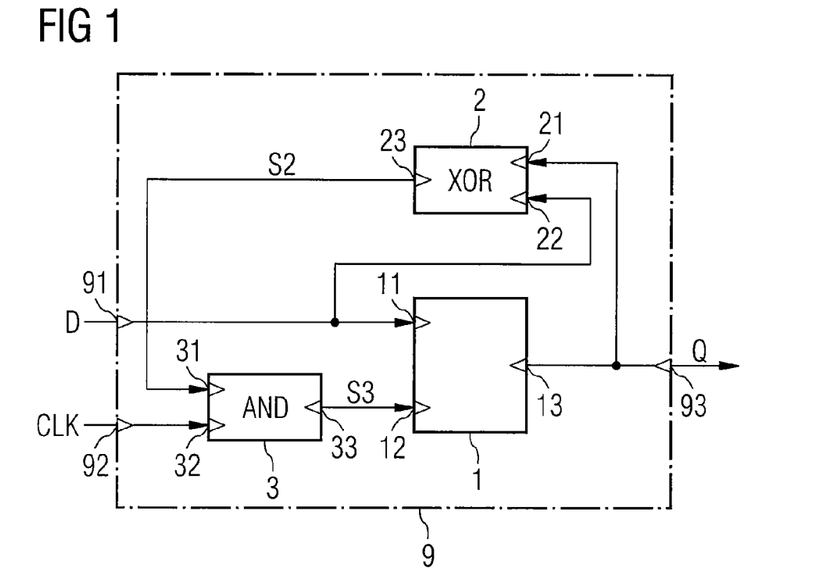
FIG. 1 shows a block diagram of an exemplary embodiment of the circuit arrangement.

FIG. 1 shows a block diagram of a circuit arrangement which is designed to buffer a state of a data signal D, which is applied to the input.

The circuit arrangement 9 has a data input 91, a set input 92 and an output 93. The circuit arrangement 9 comprises a buffer 1 having a first buffer data input 11 and a buffer set input 12 as well as a buffer output 13. The circuit arrangement 9 furthermore comprises an exclusive-OR function 2 having a first logic input 21, a second logic input 22 and a logic output 23. Provision is also made of an AND function 3 having a first logic input 31, a second logic input 32 and a logic output 33.

The data signal D is applied to the data input 11 and comprises a sequence of bits each representing a first state or a second state. The data signal D is coupled to the buffer data input 11 and to the second logic input 22 of the exclusive-OR function 2. An output signal Q which is provided at the output 93 is tapped off at the buffer output 13. The output signal Q is also fed back to the first logic input 21 of the exclusive-OR function 2. The logic output 23 of the latter is coupled to the first logic input 31 of the AND function 3. A clock signal CLK which is applied to the set input 92 is coupled to the second logic input 32 of the AND function 3. The output of the AND function 3 is coupled to the buffer set input 12.

The buffer 1 is designed to set and provide a state of a signal, which is applied to the buffer data input 11, at the output when a signal edge is applied to the buffer set input 12. A signal edge is to be understood as meaning the rising of the clock signal above a prescribed value or the falling of the clock signal below a prescribed value. The buffer is designed in such a manner that the state of the output signal Q is set at the output either upon a rising signal edge or upon a falling signal edge. Such buffers may be in the form of flip-flops.

The states which can be assumed by the data signal D at the data input 91 or by the output signal Q at the output 93 include the first state, which is also referred to as logic "1", and the second state, which is also referred to as logic "0". The first state is usually represented by a high signal level. The second state is usually represented by a low signal level.

The clock signal CLK is a periodic sequence of "0" and "1" which alternate. The state changes of the clock signal CLK which occur in the process are associated with the occurrence of a signal edge.

The exclusive-OR function 2 provides a "1" at the output when different states are applied to the logic inputs 21, 22. If the same states are applied to the input, a "0" is provided at the output. The exclusive-OR function 2 is used to detect whether the state of the input signal D differs from that of the output signal Q. In this case, a "1" is provided at the output, otherwise a "0" is provided.

The AND function 3 outputs a "1" at the output only when a "1" is applied to both the first and the second logic input 31, 32. A "0" is otherwise output. A first signal S2 is provided at the logic output 23 of the exclusive-OR function 2 and a second signal S3 is provided at the logic output 33 of the AND function 3.

Like the clock signal CLK, the logic output 23 of the exclusive-OR function 2 is coupled to the input of the AND function 3. Consequently, a "1" is provided at the logic output 33 of the AND function 3 only when both the clock signal represents a "1" and the states of the data signal D and of the output signal Q are different, which is associated with a "1" at the logic output 23 of the exclusive-OR function 2.

The buffer 1 is thus no longer set with each clock pulse of the clock signal CLK but rather only when the states of the data signal D and of the output signal Q differ from one another. This avoids the buffer 1 being set when the output signal Q would not change.

Figure 2:
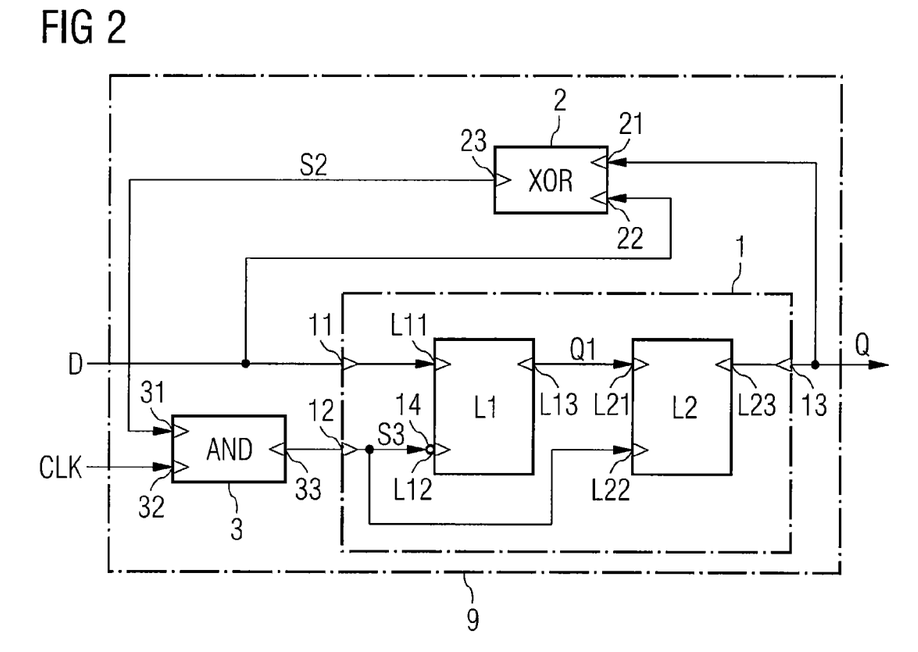
FIG. 2 shows a detailed block diagram of the circuit arrangement according to FIG. 1.

FIG. 2 shows the circuit arrangement 9 with a detailed illustration of the buffer 1. The buffer 1 comprises a first latch register and a second latch register, which are also referred to as "latches" for short, L1, L2.

Each of the latch registers L1, L2 has a first input L11, L21, a second input L12, L22 and an output L13, L23. When a "1" is applied to the second input L12, L22, the latch register L1, L2 becomes transparent. This means that the state of the signal, which is applied to the first input L11, L21, is provided at the output of the latch register L1, L2. When a "0" is applied to the second input L12, L22, the register turns off. The state provided at the output L13, L23 remains unchanged.

The second latch register L2 is connected downstream of the first latch register L1, with the result that the first input L21 of the second latch register is coupled to the output L13 of the first latch register L1. The output 33 of the AND function 3 is coupled to the second input L22 of the second latch register L2 and, via an inverter 14, to the second input L12 of the first latch register L1. The data signal D is applied to the first input L11 of the first latch register L1. The output signal Q is output at the output L23 of the second latch register L2.

As a result of the second input L12 being inverted, the first latch register L1 is transparent when the second signal S3 is at the level "0", and the second latch register L2 is transparent when the second signal S3 is at the level "1". Upon the rising edge of the second signal S3, the first latch register L1 is thus turned off and the second latch register L2 is provided with the state, which was applied to the first input L11 immediately beforehand, as an internal signal Q1. The second latch register L2 which becomes transparent then provides the state of the internal signal Q1 as the state of the output signal Q.

Figure 3:
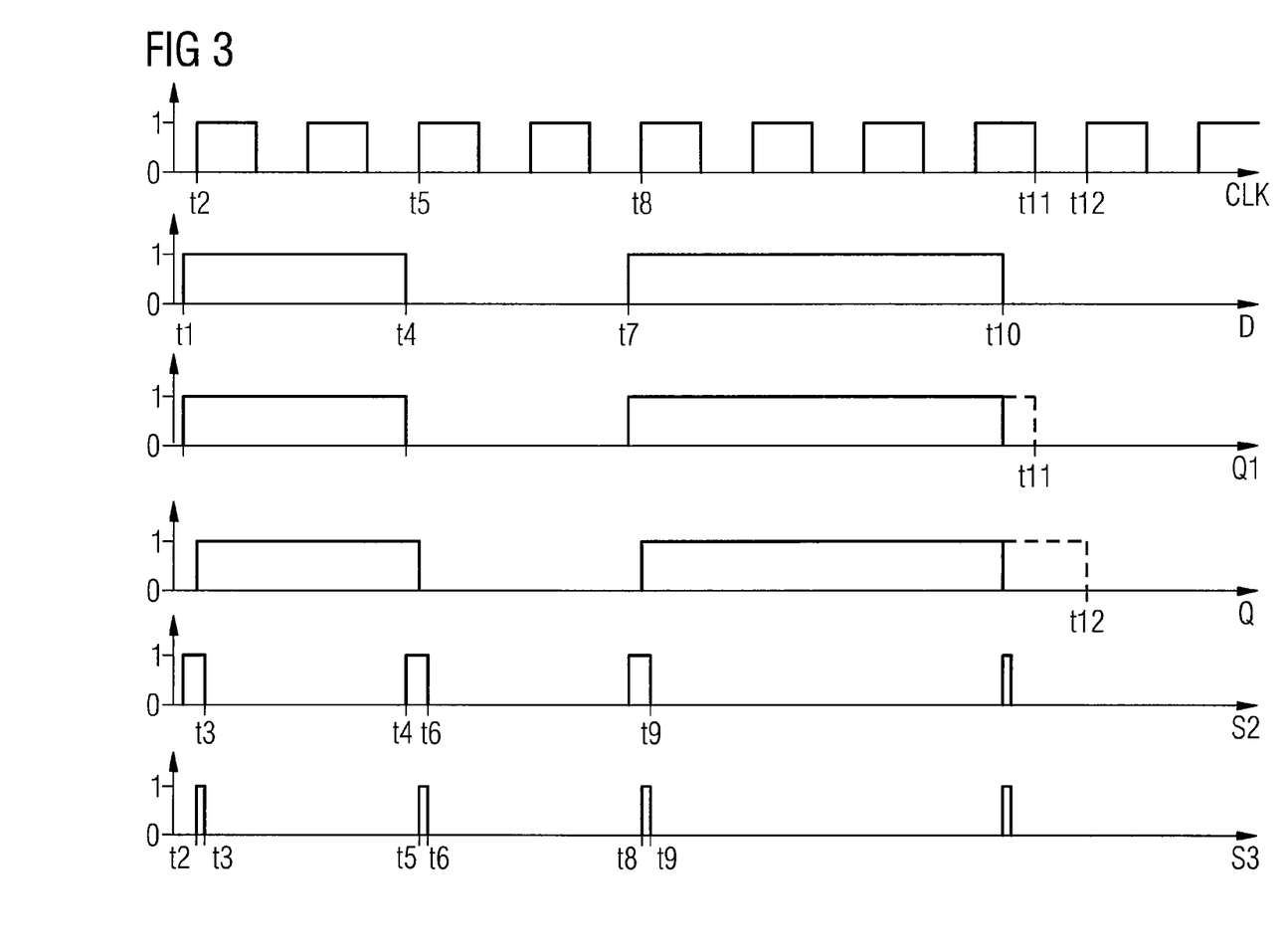
FIG. 3 shows timing diagrams of selected signals in the circuit arrangement according to FIG. 2.

FIG. 3 shows the time profiles of signals D, Q, Q1, CLK, S2 and S3 which occur in the block diagram according to FIG. 2. The first and second signals S2 and S3 are applied to the logic outputs 23, 33 of the exclusive-OR function 2 and of the AND function 3.

It shall be noted that, in this exemplary embodiment, the buffer 1 is designed in such a manner that, upon a rising edge at the set input 12, the state of the signal which is applied to the buffer data input 11 is set as the state of the output signal Q provided at the buffer output 13.

The clock signal CLK comprises a periodic sequence of "1" and "0".

At the beginning of the period of time under consideration, all of the signals considered are at the level "0".

At the time t1, the state of the data signal D changes from the level "0" to the level "1". Since the output signal Q is at the level "0" at the time t1, this change in the data signal D results in the first signal S2 at the logic output 23 of the exclusive-OR function 2 likewise becoming "1" on account of the different states of the data signal D and of the output signal Q.

As soon as the clock signal CLK rises from the level "0" to the level "1" at the time t2, the second signal S3 likewise changes to the level "1" at the logic output 33 of the AND function 3.

Applying the rising edge of the second signal S3 to the buffer set input 12 at the time t2 causes the level "1" which is then applied to the buffer data input 11 to be accepted and set. The output signal Q rises to the level "1" with a slight delay on account of the switching delay in the buffer 1. The input signal D and the output signal Q are thus at the same level and the first signal S2 falls to the level "0" at the time t3 and the second signal S3 also falls to the level "0" in association with this.

On account of the exclusive-OR function 2 and the AND function 3 being logically combined, only a relatively short pulse whose duration is, however, sufficient to set the buffer 1 is applied to the buffer set input 12.

At the time t4, the level of the data signal D falls to the level "0". The data signal D thus differs from the output signal Q. Consequently, the first signal S2 at the logic output 23 of the exclusive-OR function 2 changes to the level "1". As the clock signal CLK rises from "0" to "1" at the time t5, the second signal S3 also rises to the level "1" at the logic output 33 of the AND function 3. The buffer 1 is set as a result of the rising edge of the second signal S3. The output signal Q thus falls to the level "0". The first and second signals S2, S3 thus also fall to the level "0" again at the time t6.

At the time t7, the data signal D rises again to the level "1" and the signal changes which took place at the times t1, t2, t3 are repeated at the times t7, t8 and t9.

At the time t10, the data signal D falls from the level "1" to the level "0". In contrast to the previously described changes in the data signal D, this takes place when the level of the clock signal CLK is simultaneously "1".

The data signal D and the output signal Q now differ from one another, as a result of which the first signal S2, which indicates this change, rises to the level "1". Since the clock signal CLK which is applied to the second input 32 of the AND function 3 is already at the level "1", this change in the first signal S2 results in the output signal S3 from the AND function 3 rising to the level "1" immediately afterward. A clock edge of the second signal S3, which results in the output signal Q being set, is thus applied to the set input 12 of the buffer 1.

It shall be noted that the clock edge of the second signal S3, which is thus applied to the set input 12 of the buffer 1, is not in synchronism with the clock signal CLK. Therefore, the output signal Q is not set at the same time as the rising clock edge of the clock signal CLK but rather asynchronously with respect to the latter immediately after the change in the data signal D. However, this occurs only when the data signal is changed over when the clock signal CLK is at the level "1". The practice of changing over when the clock signal CLK is at the level "0" results in the changed state of the data signal D only being provided as the output signal Q upon the rising edge of the clock signal CLK, as already described above.

In addition to the immediate changeover at the time t10, FIG. 3 uses dashed lines to illustrate the changeover behavior strived for, as would take place during conventional clocking, for example. At the time t11, the first latch register L1 would become transparent as the level of the clock signal CLK fell to "0" and the internal signal Q1 would thus fall to the level "0" now assumed by the data signal D. As the clock edge rose at the time t12, the second latch register L2 would become transparent and would also provide the changed level "0" at the output.

In comparison with a conventional buffer arrangement which is set upon each rising clock edge of the clock signal CLK, the buffer in the arrangement described in FIG. 1 and FIG. 2 is set only when the data signal D and the output signal Q differ from one another. This is similar to an asynchronous circuit concept. This considerably reduces the power consumption of this arrangement since switching operations which consume power are associated with each set input within the buffer 1. On account of the considerable reduction in the switching operations, the power consumption of the buffer in the circuit arrangement is also reduced.

The problem with the circuit illustrated in FIG. 2 is that, when a change in the data signal occurs while the level of the clock signal CLK is "1", the exclusive-OR function 2 and the AND function 3 do not have sufficient time to stabilize their outputs. An undesirable clock edge thus not only occurs but the functional reliability of the switching operation as a whole is also impaired.

Nevertheless, this circuit arrangement saves a large amount of power.

Figure 4:
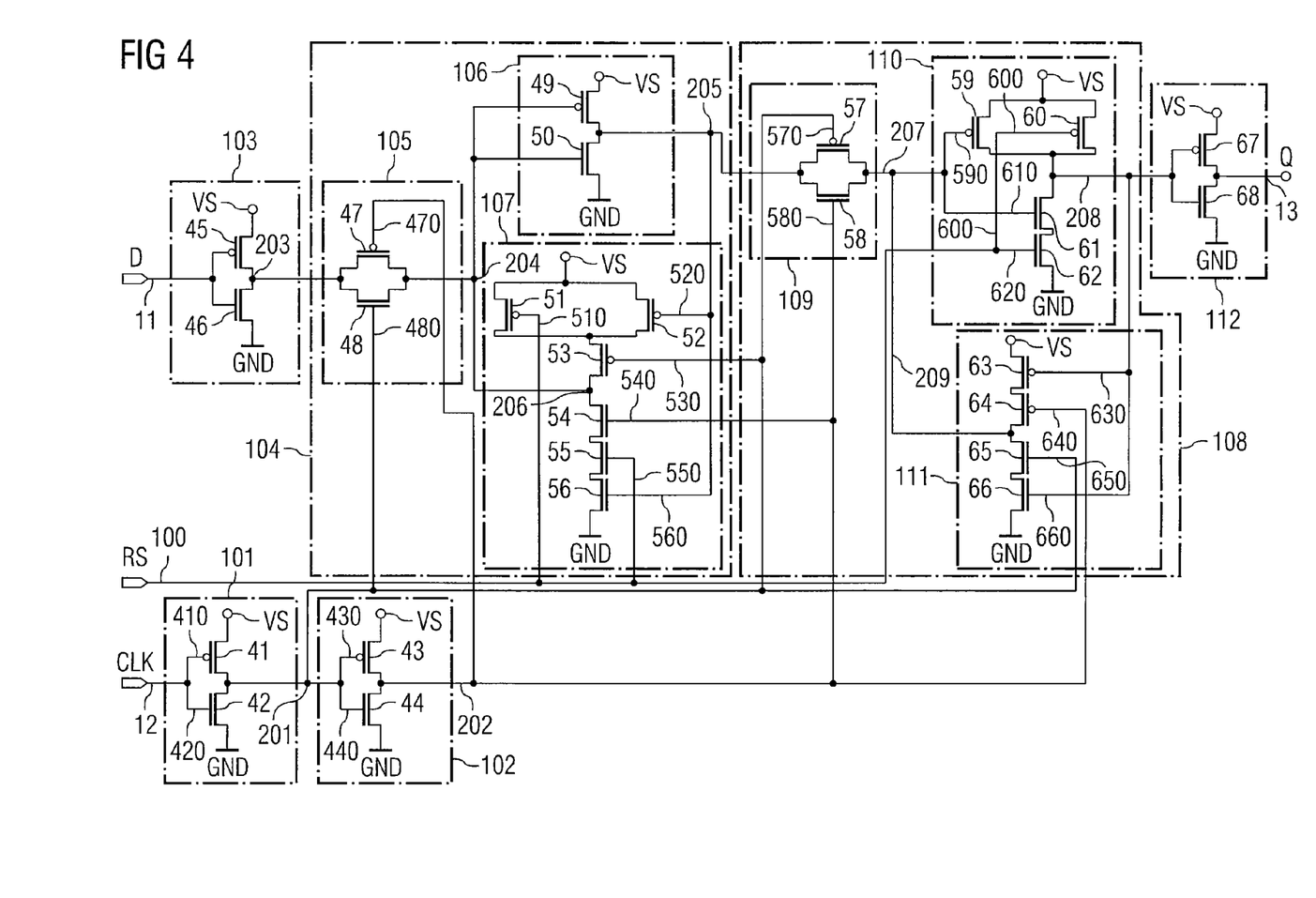
FIG. 4 shows an exemplary embodiment of a flip-flop.

FIG. 4 shows an exemplary embodiment of a flip-flop which is conventionally set upon each applied clock edge.

The flip-flop comprises a buffer data input 11 for applying the data signal D, a buffer set input 12 for applying the periodic clock signal CLK and a buffer output 13 for providing the output signal Q. In addition, provision is also made of a reset input 100 for applying a reset signal RS.

The flip-flop comprises a multiplicity of transistors which can be combined to form functional circuit parts.

Connected downstream of the buffer set input 12 is a first inverter 101 having an NMOS transistor 41 and a PMOS transistor 42 which are connected in series between a first connection for applying a supply potential VS, which represents the level "1", and a second connection for applying a reference potential GND, which represents the level "0".

When a signal level "0" is applied to the control input 410 of the NMOS transistor 41, the NMOS transistor is on. When a high signal level "1" is applied, the NMOS transistor turns off. The PMOS transistor 42 is on when a high signal level "1" is applied to its control input 420 and turns off when a low signal level "0" is applied.

The control inputs 410, 420 of the transistors 41, 42 are driven using the clock signal CLK. The potential at a first node 201 between the NMOS transistor 41 and the PMOS transistor 42 is at a level that is inverse to that of the clock signal CLK.

A second inverter 102 having the transistors 43, 44 is connected downstream of the first inverter 101. The control inputs 430, 440 of the transistors 43, 44 are coupled to the first node 201, with the result that the clock signal is provided again at a second node 202 between the transistors 43 and 44.

At the first and second nodes 201, 202, the instantaneous state of the clock signal CLK and the inverse state of the clock signal CLK are provided to all of the further functional circuit parts.

The flip-flop in FIG. 4 comprises two latch registers 104, 108 which are also known as "latches". These latch registers 104, 108 are connected in series in a so-called master/slave arrangement. The latch registers 104 and 108 are locked in a complementary manner to one another. When the clock signal CLK at the buffer set input 12 is at the level "0", the data signal D is read into the master latch register 104. The slave latch register 108 remains locked, with the result that the state provided at a buffer output 13 is unchanged in this case. The slave latch register 108 locks.

When the clock signal CLK which is applied to the buffer set input 12 rises to the level "1", the master latch register 104 is locked and the state of the signal, which was applied immediately before the positive clock edge, is frozen in this manner. At the same time, the slave latch register 108 is enabled and the state of the master latch register 104 is thus transmitted to the buffer output 13.

Data are thus transmitted upon the positive clock edge. However, there is no clock state in which the input data act directly on the output.

A third inverter 103 having two transistors 45, 46 for inverting the data signal D is connected between the buffer data input 11 and a third node 203 at the input of the master latch register 104.

The master latch register 104 comprises circuit parts 105, 106, 107. A first transfer gate 105 is connected downstream of the third node 203 at the input of the master latch register 104. The first transfer gate 105 comprises an NMOS transistor 47 and a PMOS transistor 48 which are connected in parallel. A control input 470 of the NMOS transistor 47 is coupled to the first node 201 and a control input 480 of the PMOS transistor 48 is coupled to the second node 202.

When the clock signal CLK is at the level "0", the transistors 47 and 48 are turned on, the first transfer gate 105 becomes transparent and the inverse data signal is applied to a fourth node 204 at the output of the first transfer gate 105. When the clock signal CLK is at the level "1", the first transfer gate 105 locks and the inverse data signal applied to the third node 203 is decoupled from the fourth node 204. A fourth inverter 106, which has the transistors 49 and 50, and a NAND gate 107, which can be set, are connected between the fourth node 204 and a fifth node 205.

The data signal which is applied to the output of the fourth inverter 106 at the fifth node 205 is coupled to the NAND gate 107 which can be set. The NAND gate 107 which can be set comprises a first NMOS transistor 51 and a second NMOS transistor 52, which is connected in parallel with the latter, as well as a third NMOS transistor 53 and a first, a second and a third PMOS transistor 54, 55, 56. The third NMOS transistor 53 and the first, second and third PMOS transistors 54, 55, 56 are connected in series with the first and second NMOS transistors 51, 52, which are connected in parallel, between the first connection for applying the supply potential VS and the second connection for applying the reference potential GND. A sixth node 206 between the third NMOS transistor 53 and the first PMOS transistor is feedback-connected to the fourth node 204.

The control inputs 520, 560 of the second NMOS transistor 52 and of the third PMOS transistor 56 are coupled to the fifth node 205. The control input 530 of the third NMOS transistor 53 is coupled to the first node 201. The control input 540 of the first PMOS transistor 54 is coupled to the second node 202. The reset signal RS is coupled to the control inputs 510, 550 of the first NMOS transistor 51 and of the second PMOS transistor 55.

The third NMOS transistor 53 and the first PMOS transistor 54 turn off when the clock signal CLK is at the level "0". In this case, the sixth node 206 between these transistors 53, 54 is decoupled on account of the high impedance. When the clock signal CLK is at the level "1" and the second and third PMOS transistors 55 and 56, which are connected in series, are on, the reference potential GND or the level "0" is applied to the sixth node 206. This is the case when both the reset signal RS and the data signal at the fifth node 205 are at the level "1". When either the data signal at the fifth node 205 or the reset signal RS is at the level "0", at least one of these PMOS transistors 55 and 56 turns off and at least one of the NMOS transistors 51 and 52, which are connected in parallel, is on, with the result that the level "1" is provided at the sixth node 206.

The signal which is inverse to that at the fifth node 205 is thus applied to the sixth node 206 when both the clock signal CLK and the reset signal RS are at the level Since the first transfer gate 105 locks when the clock signal CLK is at the level "1", the state which is applied to the sixth node 206 and is fed back to the fourth inverter 106 is stable. The state which is applied to the buffer data input 11 before turning off is thus frozen.

The slave latch register 108 comprises a second transfer gate 109, a NAND gate 110 and an inverter 111 which can be set. The fifth node provides the input signal 205 of the slave latch register 108. The second transfer gate 109 is coupled between the fifth node 205 and a seventh node 207. The second transfer gate 109 comprises an NMOS transistor 57 and a PMOS transistor 58 which is connected in parallel with the latter. The control inputs 570, 580 of these transistors 57, 58 are coupled to the first and second nodes 201, 202 in the opposite manner to that in the case of the first transfer gate 105, with the result that the second transfer gate 109 is transparent when the clock signal is at the level "1". In this case, the signal which is applied to the fifth node 205 is coupled to the seventh node 207 of the transfer gate.

The NAND gate 110 comprises a first NMOS transistor 59 and a second NMOS transistor 60 which are connected in parallel. A first PMOS transistor 61 and a second PMOS transistor 62 are coupled in series with said NMOS transistors in such a manner that the NMOS transistors 59 and 60 are coupled to the first connection for the supply potential VS and the second PMOS transistor 62 is coupled to the second connection for the reference potential GND. The control connections 590, 610 of the first NMOS transistor 59 and of the first PMOS transistor 61 are coupled to the seventh node 207. The reset signal RS is coupled to the control connections 600, 620 of the second NMOS transistor 60 and of the second PMOS transistor 62.

The level "1" is applied to an eighth node 208 between the NMOS transistors 59, 60, which are connected in parallel, and the first PMOS transistor 61 when both the accepted data signal at the node 207 and the reset signal RS are at the level "0". The inverse accepted data signal is thus applied to the eighth node 208 when the reset signal RS is at the level "1".

The inverter 111 which can be set comprises a series circuit comprising a first NMOS transistor 63 and a second NMOS transistor 64 as well as a first PMOS transistor 65 and a second PMOS transistor 66, which are coupled between the first connection for the supply potential VS and the second connection for the reference potential GND. The signal which is applied to the eighth node 208 is coupled to the control connections 630, 660 of the first NMOS transistor 63 and of the second PMOS transistor 66. The control connection 640 of the second NMOS transistor 64 is coupled to the first node 201 and the control connection 650 of the first PMOS transistor is coupled to the second node 202, with the result that these transistors 64, 65 are on when the clock signal CLK is at the level "0". In this case, the level which is inverse to that at the eighth node 208 is applied to a ninth node 209. When the clock signal CLK is at the level "1", the ninth node 209 is decoupled.

The ninth node 209 is coupled to the seventh node 207, with the result that the signal which is applied to the ninth node 209 is also applied to the input of the NAND gate 110. The accepted state thus remains frozen in the slave latch register 108 in a stable manner, even after the second transfer gate 109 has turned off, and is provided at the output.

A fifth inverter 112 is connected downstream of the eighth node 208, the output signal Q being provided at the buffer output 13 between the transistors 67 and 68 of said inverter.

The reset signal RS controls the flip-flop in such a manner that the set data signal D is provided at the buffer output 13 when the reset signal RS is at the level "1". When the reset signal RS is at the level "0", the level "1" is inevitably applied to the eighth node 208. The output signal Q is thus at the level "0" at the output of the downstream fifth inverter 112, irrespective of the input signal D.

The transistors in this circuit arrangement, which are controlled on the basis of the clock signal CLK at the set input 12, are switched upon each clock edge of the clock signal CLK, which is associated with high power consumption.

Figure 5:
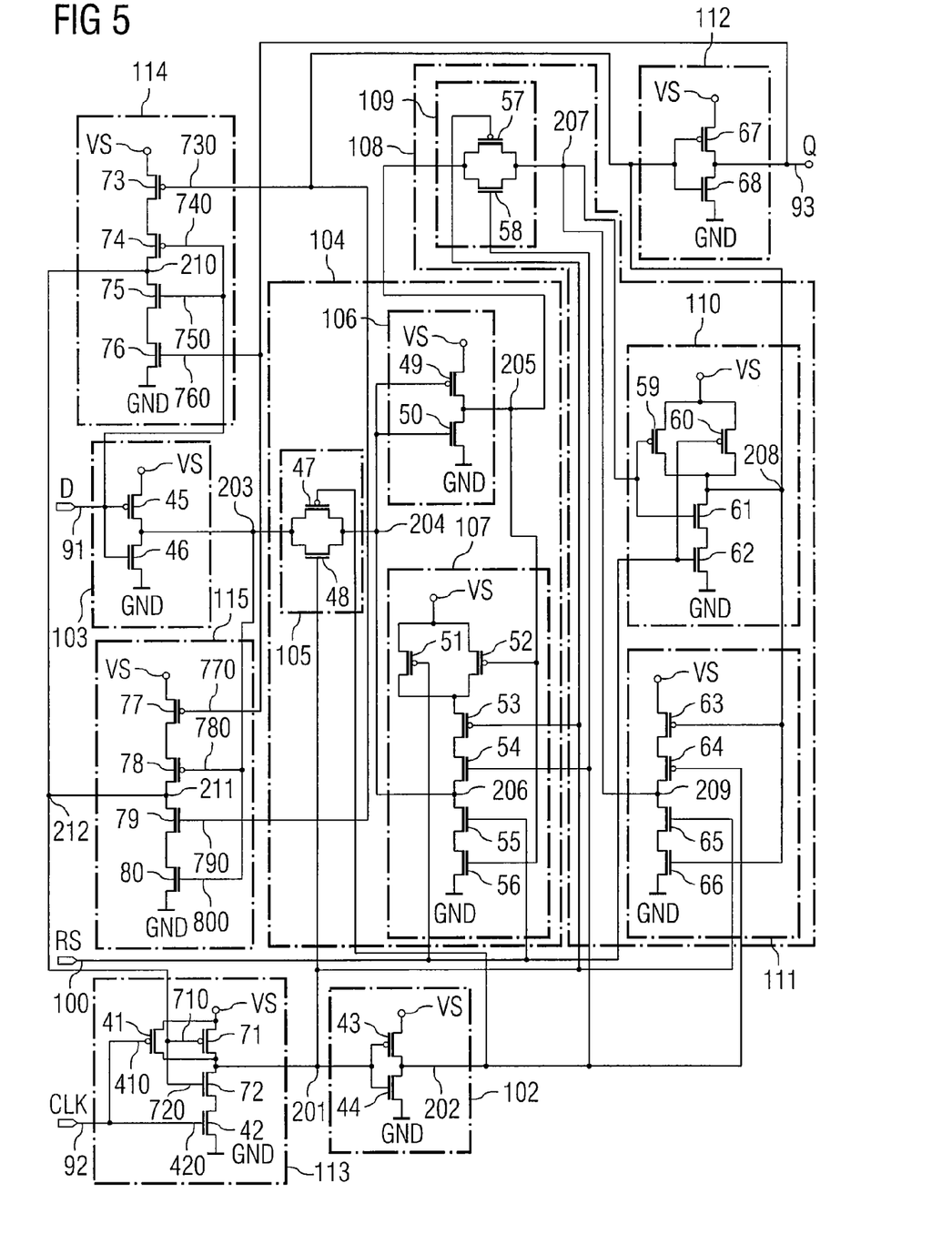
FIG. 5 shows an exemplary embodiment of a power-saving flip-flop.

FIG. 5 shows one exemplary embodiment of the buffer arrangement according to the invention which differs from the arrangement in FIG. 4 by virtue of the fact that ten further transistors 71 to 80 are provided. These transistors 71 to 80 are the circuitry embodiment of the exclusive-OR and AND functions 2, 3 illustrated in FIG. 1. On account of this extension, the former buffer data input 11, the buffer set input 12 and the buffer output 13 are now denoted the data input 91, the set input 92 and the output 93 in accordance with the reference symbols in FIG. 1.

In FIG. 5, provision is made of a first additional gate 114 which comprises a series circuit comprising a first NMOS transistor 73 and a second NMOS transistor 74 as well as a first PMOS transistor 75 and a second PMOS transistor 76 between the first connection for the supply potential VS and the second connection for the reference potential GND. The output signal Q which is applied to the output 13 is coupled to the control connection 760 of the second PMOS transistor 76. The inverse output signal which is applied to the eighth node 208 is coupled to the control connection 730 of the first NMOS transistor 73. The data signal D which is applied to the data input 91 is coupled to the control connections 740, 750 of the second NMOS transistor 74 and of the first PMOS transistor 75.

The level "1" is provided at a tenth node 210 between the second NMOS transistor 74 and the first PMOS transistor 75 when the data signal D is at the level "0" and the output signal Q is at the level "1". When both the data signal D and the output signal Q are at the level "1", the PMOS transistors 75 and 76 are on and the level "0" is applied to the tenth node 210. When both the data signal D and the output signal Q are at the level "0" or the data signal D is at the level "1" and the output signal Q is at the level "0", the tenth node 210 is decoupled.

A second additional gate 115 comprises a series circuit comprising a first NMOS transistor 77, a second NMOS transistor 78, a first PMOS transistor 79 and a second PMOS transistor 80 between the first connection for the supply potential VS and the second connection for the reference potential GND. The inverse data signal which is provided at the third node 203 is coupled to the control connections 780, 800 of the second NMOS transistor 78 and of the second PMOS transistor 80. The output signal Q is coupled to the control connection 770 of the first NMOS transistor 77. The inverse output signal from the eighth node 208 is coupled to the control connection 790 of the first PMOS transistor 79.

The level at an eleventh node 211 between the second NMOS transistor 78 and the first PMOS transistor 79 is "1" when the data signal D is at the level "1" and the output signal Q is at the level "0". The level at the eleventh node 211 is "0" when the data signal D and the output signal Q are at the level "0". The eleventh node 211 is decoupled in the case of the other level combinations of the data signal D and the output signal Q.

A twelfth node 212 couples the tenth and eleventh nodes 210, 211, with the result that a defined level "1" or "0" is applied to the twelfth node 212 in the case of any possible combination of the levels "1" and "0" of the data signal D and of the output signal Q. The level at the twelfth node 212 is "1" when the data signal D and the output signal Q are at different levels, otherwise the level at the twelfth node 212 is "0". The exclusive-OR function 2 is thus formed by the first and second additional gates 114, 115.

Instead of the first inverter 101, a third additional gate 113 is provided between the set input 92 and the first node 201 in FIG. 5. The third additional gate 113 comprises, between the first connection for the supply potential VS and the second connection for the reference potential GND, a first NMOS transistor 41 and a second NMOS transistor 71, which is connected in parallel with the latter, and a first PMOS transistor 72 and a second PMOS transistor 42 which are connected in series with said NMOS transistors. The clock signal CLK which is applied to the set input 92 is coupled to the control connections 410, 420 of the first NMOS transistor 41 and of the second PMOS transistor 42. The signal which is applied to the twelfth node 212 controls the second NMOS transistor 71 and the first PMOS transistor 72 via their control connections 710, 720.

When the level "1" is applied to both the twelfth node 212 and the set input 92, the PMOS transistors 42, 72 are turned on and the level at the first node 201 is "0". Otherwise, at least one of the NMOS transistors 41, 71 is on, with the result that the level at the first node 201 is "1". The level at the second node 202 to which the inverted signal of the first node 201 is applied is thus "1" only when both the clock signal CLK and the signal at the twelfth node 212 are at the level "1".

A signal which represents ANDing of the clock signal CLK and of the output signal from the exclusive-OR function 2 is thus provided at the second node 202. The inverse signal is applied to the first node 201.

The state thus changes at the first node 201 and at the second node 202, which provide the set signals for the buffer circuit having the transistors 41 to 68, only when the input signal D and the output signal Q differ from one another and the clock signal CLK is at the level "1". Clock edges thus set the actual flip-flop only when the states of the data signal D and of the output signal Q differ from one another.

Other circuitry arrangements for forming the exclusive-OR function and the AND function are also conceivable. For example, the PMOS transistors may be replaced with NMOS transistors if the inverted control signals are coupled to them. The same applies to replacing the NMOS transistors with PMOS transistors.

This is associated with considerably reduced power consumption on account of the smaller number of switching operations of the transistors. The power saving may be in the range from one to several orders of magnitude.

The described circuit having a logic unit connected upstream of the set input is also conceivable for other refinements of flip-flops.

Figure 6:
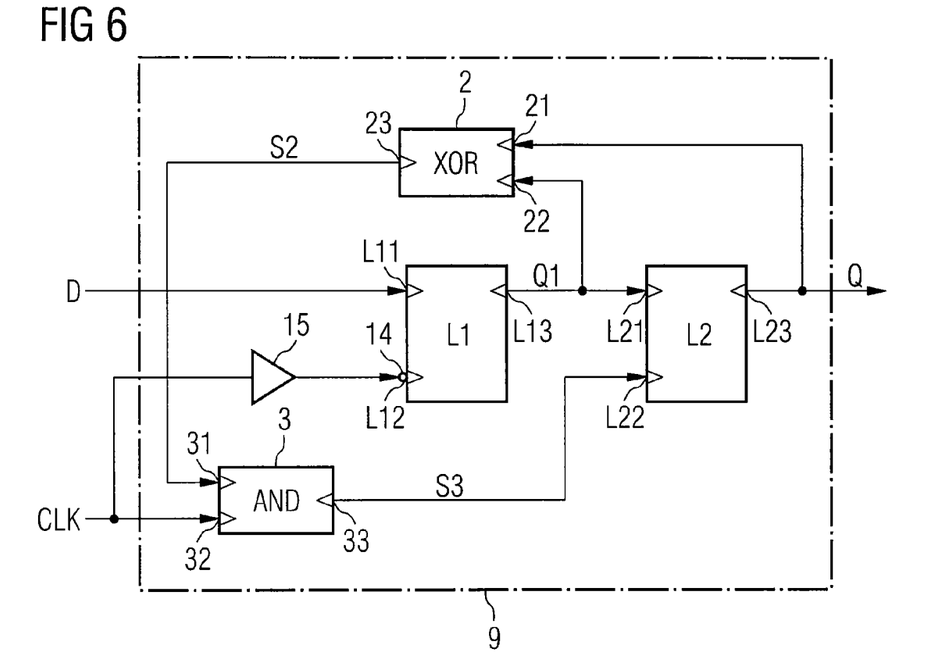
FIG. 6 shows a detailed block diagram of another exemplary embodiment of the circuit arrangement.

FIG. 6 shows another exemplary embodiment of the circuit arrangement in the form of a block diagram. This differs from the circuit arrangement illustrated in FIG. 2 by virtue of the way in which the latch registers L1 and L2 are coupled to the exclusive-OR function 2 and to the AND function 3. Only the differences will be discussed below.

The internal signal Q1 which is provided at the output L13 of the first latch register is coupled to the second logic input 22 of the exclusive-OR function 2. The first signal S2 is thus at the level "1" at the output of the exclusive-OR function 2 when the internal signal Q1 and the output signal Q differ from one another.

An inverter 14 is connected upstream of the second input L12 of the first latch register L1, the clock signal CLK being coupled to said inverter. In this case, a buffer 15 may be connected upstream of the inverter 14.

This circuit arrangement protects the clock signal CLK and avoids the asynchronous occurrence of clock edges at the second input L12 of the first latch register L1. This is described below.

Figure 7:
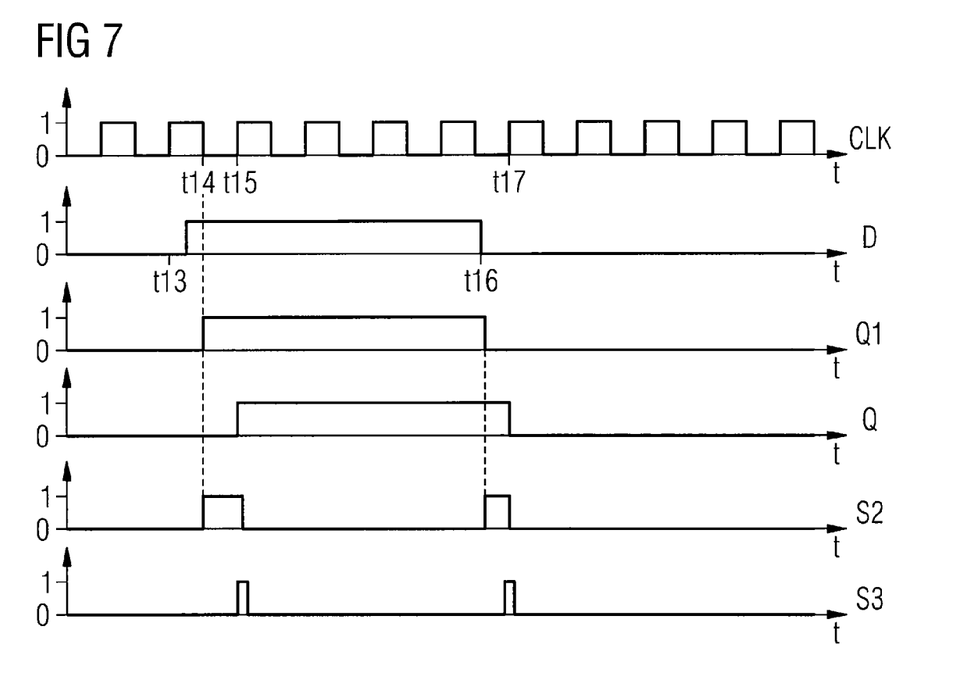
FIG. 7 shows timing diagrams of selected signals in the circuit arrangement according to FIG. 6.

FIG. 7 shows the temporal profile of selected signals in the circuit arrangement according to FIG. 6. The clock signal CLK, the data signal D, the internal signal Q1, the output signal Q and the first and second signals S2, S3 are illustrated against time.

At the time t13, the level of the data signal rises from "0" to "1", while the clock signal CLK is at the level "1". Since the first latch register L1 turns off when the clock signal CLK is at the level "1", the internal signal Q1 remains unchanged at the level "0". The first latch register L1 becomes transparent and the internal signal Q1 rises to the level "1" only when the clock signal CLK falls to the level "0" at the time t14.

As a result of the changed level of the internal signal Q1, the latter differs from the output signal Q, which, in the case of the exclusive-OR function 2, results in the first signal S2 assuming the level "1".

The level of the second signal S3 at the output of the AND function 3 thus rises to the level "1" as soon as the clock signal CLK rises to the level "1" again at the time t15. As a result, the second latch register L2 becomes transparent and the output signal Q is set.

At the time t16, the data signal D falls to the level "0", while the clock signal CLK is at the level "0". At this time, the first latch register L1 is transparent, with the result that the internal signal Q1 consequently likewise falls to the level "0". The first signal S2 thus rises to the level "1".

At the time t17, the clock signal CLK changes to the level "1" upon a rising edge. A clock edge of the signal S3 is thus also provided at the output of the AND function 3, said clock edge resulting in the second latch register L2 becoming transparent and the output signal Q being reset.

This circuit arrangement differs from the circuit arrangement in FIG. 2 by virtue of the fact that the first latch register L1 is set with each clock pulse but the second latch register L2 is set only when the internal signal Q1 and the output signal Q differ from one another, which results from a change in the data signal D.

Figure 8:
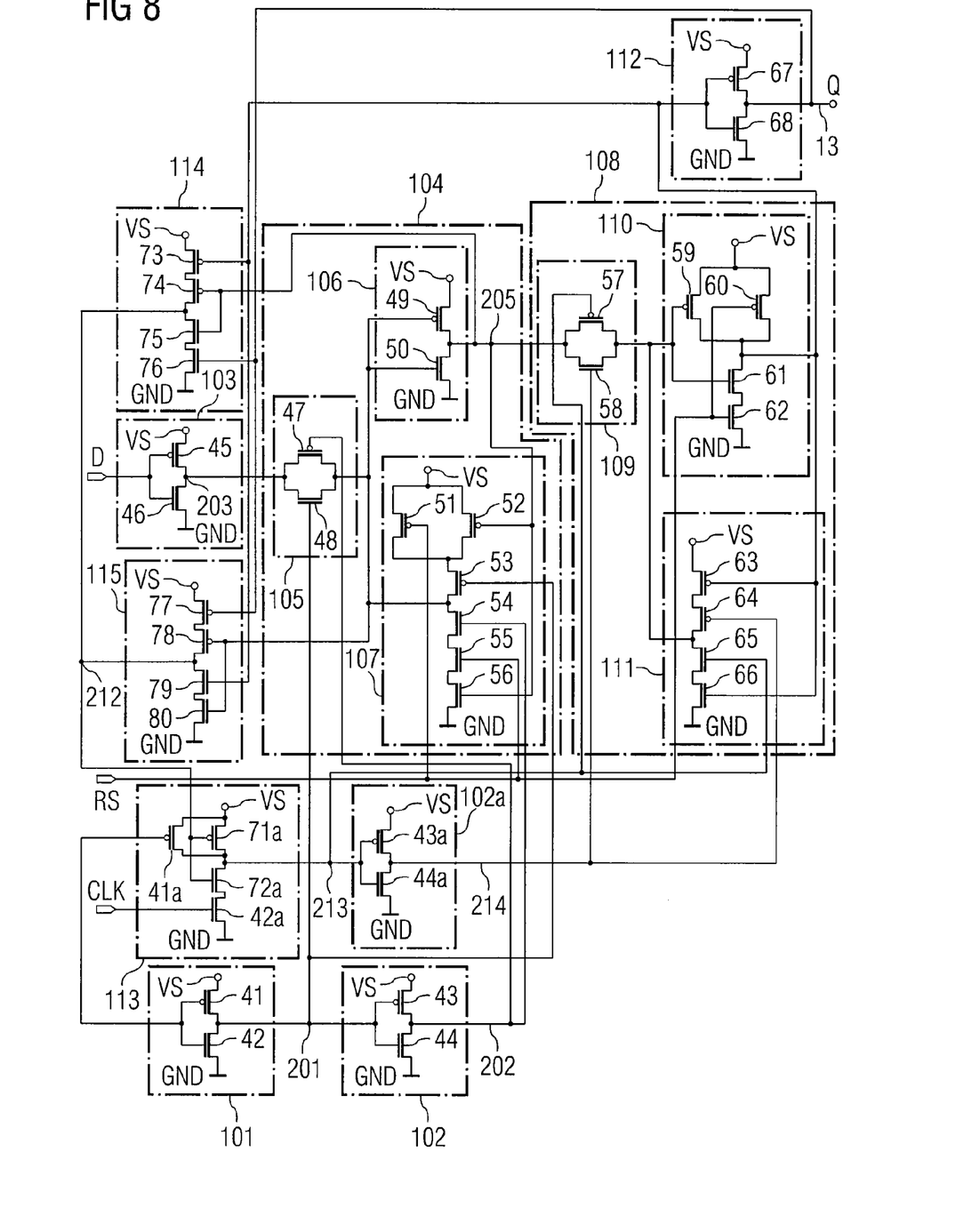
FIG. 8 shows another exemplary embodiment of a power-saving flip-flop.

FIG. 8 shows, by way of example, the circuit arrangement of this exemplary embodiment in the form of a flip-flop. Only the differences from the circuit arrangement in FIG. 5, which has already been described in detail, will be discussed below.

The fundamental difference is that, in addition to the circuit part 113, which is a circuitry embodiment of the AND function 3, and the inverter 102a for providing the inverse second signal downstream of the AND function, provision is made of the circuit parts 101 and 102 which are already known from the conventional circuit arrangement according to FIG. 4. These circuit parts 101 and 102 are used to provide the clock signal CLK and the inverted clock signal. The inverted clock signal which is provided at the first node 201, and the clock signal which is provided at the second node 202, at the output of these circuit parts 101, 102 are coupled to the first transfer gate 105 in such a manner that the latter becomes transparent when the clock signal CLK is at the level "0". The transistors in the circuit parts 106 and 107, which are coupled to the first node 201 and to the second node 202, are now also clocked on the basis of the applied clock signal CLK and the inverse clock signal.

Rather than being coupled to the data signal, the circuit parts 114, 115 which form the exclusive-OR function are coupled to the internal signal which is provided at the fifth node 205 at the output of the first latch register 104.

This circuit arrangement having a protected clock signal thus comprises four further transistors.

It can be noted, in summary, that an embodiment of one circuit arrangement comprises a data input for applying a data signal, a set input for applying a set signal and an output for providing an output state. The output is coupled to the data input and to the set input in such a manner that the output state provided is set only when an input state of the data signal, which is applied to the data input, and the output state differ from one another and the set signal changes to a prescribed state.

The advantage of an exemplary embodiment of the circuit arrangement according to the invention is that the state at the output is set only when it needs to be changed. This is associated with a considerable power saving.

The buffer is advantageously configured in such a manner that an output state is set only when a set edge of the set signal is applied to the set input and the set operations are thus in synchronism with the clock signal.

In one advantageous refinement, the circuit arrangement comprises a buffer whose buffer data input is coupled to the data input and whose buffer output is coupled to the output. The buffer is coupled to a logic unit in such a manner that the buffer is set only when the abovementioned requirements have been met. Besides the transistors which the buffer comprises, only a few additional circuit elements are required for the logic unit.

In one advantageous refinement, the buffer comprises a first latch register and a second latch register which is connected downstream of the latter, said registers each providing the state of a signal, which is applied to a first latch register input, at the output when a prescribed state is applied to a second latch register input. When another state is applied to the second latch register input, the output state remains unchanged. Setting is affected by the state which is provided by the first latch register being accepted and provided by the second latch register. In this case, the two latch registers are not transparent at the same time. The logic unit can control either both latch registers, which saves a large amount of power, or only the second latch register, thus safeguarding the clock synchronicity of the setting operation with respect to the clock signal.

The logic unit advantageously comprises an exclusive-OR function in order to check whether the input state of the data signal at the data input or inside the buffer and the output state of the output signal at the output differ from one another. The logic unit also comprises an AND function in order to check whether both these states and the state of the set signal, which is applied to the set input, meet the requirements for setting the buffer. These logic functions can be embodied in a simple manner using gates.

In order to allocate values to logic states inside the circuit arrangement, provision is made of a first connection for applying a supply potential and a second connection for applying a reference potential. These applied potentials make it possible to represent the logic states using different signal levels.

The transistors which the exclusive-OR function and the AND function comprise have control connections to which a control signal can respectively be coupled, so that the transistors are either on or off. The data signal having the input state, the output signal having the output state or the set signal having the state which is applied to the set input or the inverse signals having the inverse states is/are coupled to the control connections in a suitable manner. This signifies a small amount of additional design complexity and space for the exclusive-OR and AND functions.

A reset input for deactivating the output is advantageously provided in order to increase the flexibility of the circuit arrangement.

An integrated circuit arrangement is particularly space-saving.

The method for setting an output state which is provided at an output of a circuit arrangement for buffering comprises the steps of:

detecting an input state of a data signal, which is applied to a data input of the circuit arrangement, and a state of a set signal which is applied to a set input of the circuit arrangement, and setting the output state only as soon as the state which is applied to the set input or the input state which is applied to the data input is changed to the effect that a prescribed state is applied to the set input and the input state and the output state have a prescribed relationship with respect to one another.

The advantage of this method is that the output state is not set with each clock pulse but rather only when the output state changes, which is associated with a considerable power saving.

In order to check whether the output state needs to be set, the states of the data signal at the data input, of the output signal at the output and of the set signal at the set input are detected with respect to the prescribed relationship or with respect to the required state.

The output state is advantageously set only when a clock edge of the set signal occurs in order to avoid setting it out of synchronism with the clock signal.

The circuit arrangement advantageously comprises a buffer whose buffer data input is coupled to the data input and whose buffer output is coupled to the output and which is set using a suitable signal when the given requirements have been met. The method can thus be used to operate a buffer in a power-saving manner.

In one advantageous implementation of the method, the prescribed relationship is tested using gates. This is a reliable testing method. The signal provided at the output of the gate is used to set the buffer.

What is claimed is:

1. A circuit arrangement comprising:
   a data input configured to apply a data signal;
   a set input configured to apply a set signal;
   an output configured to provide an output state, said output being coupled to the data input and to the set input such that the output state provided is set only when an input state of the data signal and the output state differ from one another and the set signal changes to a prescribed state;
   a buffer comprising a first latch register and a second, downstream latch register, said registers being coupled between a buffer data input and a buffer output, the first latch register being set when the set signal is in a first state, and the second latch register being set only when the set signal is in a second state and the input state differs from the output state; and
   a logic unit coupled to the buffer and configured to set the buffer such that the input state of the applied data signal is provided as an output state at the output.

2. The circuit arrangement as claimed in claim 1, wherein the output state is set only when a clock edge of the set signal is applied to the set input.

3. The circuit arrangement as claimed in claim 1, wherein the logic unit comprises a first logic input, a second logic input, a third logic input and a logic output, the second logic input being coupled to a data signal which is tapped off upstream of the buffer or inside the buffer, the first logic input being coupled to the buffer output, the third logic input being coupled to the set input, and the logic output being coupled to a latch register set input of the second latch register.

4. The circuit arrangement as claimed in claim 3, wherein the second logic input is coupled to a latch register output of the first latch register.

5. The circuit arrangement as claimed in claim 3, wherein the first and second logic inputs are coupled by means of an exclusive-OR function that is connected downstream of an AND function whose input also has the third logic input coupled thereto and whose output is coupled to the logic output.

6. The circuit arrangement as claimed in claim 1, wherein the set input is coupled to a latch register set input of the first latch register.

7. A circuit arrangement comprising:
   a data input for applying a data signal;
   a set input for applying a set signal;
   an output for providing an output signal; and
   a first latch register and a second, downstream latch register, said registers being coupled between the data input and the output, an output state of the first latch register being set, with the result that the state of the signal that is applied to the input is provided at the output when the set signal has a prescribed state, and an output state of the second latch register being set only when the set signal has another prescribed state and the state of the output signal and the state of the data signal differ from one another.

8. The circuit arrangement as claimed in claim 7, further comprising an EXCLUSIVE-OR function whose inputs are coupled to an output of the first latch register and to an output of the second latch register.

9. The circuit arrangement as claimed in claim 8, further comprising an AND function whose inputs are coupled to an output of the EXCLUSIVE-OR function and to the set input and whose output is coupled to a latch register set input of the second latch register.

10. The circuit arrangement as claimed in claim 7, wherein the set input is coupled to a latch register set input of the first latch register.

11. The circuit arrangement as claimed in claim 8, wherein the exclusive-OR function comprises a first and a second gate each having an output node and four transistors which are coupled in series and are coupled such that:
the first state is applied to an output node of the first gate when the data signal assumes the first state and the output signal assumes the second state,
the second state is applied to the output node of the first gate when the input signal and the output signal assume the same state,
the first state is applied to an output node of the second gate when the data signal assumes the second state and the output signal assumes the first state, and
the second state is applied to the output node of the second gate when the data signal and the output signal assume another identical state.

12. The circuit arrangement as claimed in claim 11, wherein the AND function comprises a third gate having transistors whose control connections are coupled to one of the coupled output nodes of the first and second gates or to the set input such that the first state is applied to an output node of the AND function when the first state is applied both to the set input and to the coupled output node.

13. The circuit arrangement as claimed in claim 7, further comprising a first connection for applying a supply potential in order to allocate a value to a first state of the output signal and circuit-internal signals.

14. The circuit arrangement as claimed in claim 13, further comprising a second connection for applying a reference potential in order to allocate another value to a second state of the output signal and the circuit-internal signals.

15. The circuit arrangement as claimed in claim 7, further comprising a reset input in order to set a prescribed state at the output.

16. A method for setting an output state of an output signal which is provided at an output of a circuit arrangement, the method comprising:
detecting an input state of a data signal, which is applied to a data input of the circuit arrangement, and a state of a set signal, which is applied to a set input of the circuit arrangement; and
setting the output state only when the input state and the output state differ from one another and the set signal changes to a prescribed state,
wherein the circuit arrangement comprises a first latch register set when the set signal changes from a first to a second state such that the input state of the data signal is provided at the output of the first latch register, and an output state of a second latch register is set only when the set signal changes from the second to the first state and the output state and the state of the data signal differ from one another.

17. The method as claimed in claim 16, wherein the output state is set when a clock edge of the set signal occurs.

18. The method as claimed in claim 16, further comprising an internal set signal setting the second latch register.

19. The method as claimed in claim 18, further comprising generating the internal set signal by generating a signal from the data signal and the output signal by means of an exclusive-OR function, which signal is logically combined with the set signal using an AND function to form the internal set signal.

20. The method as claimed in claim 19, further comprising tapping off the data signal upstream or downstream of the first latch register.

21. The method as claimed in claim 16, further comprising tapping off the data signal at the output of the second latch register.

22. A circuit arrangement comprising:
a buffer means, which includes a data input for applying a data signal, a set input for applying a set signal, output for providing an output state, and a first latch register and a second. downstream latch register, for buffering the data signal;
wherein said registers are coupled between the data input and the output, the first latch register being set when the set signal is in a first state, and the second latch register being set only when the set signal is in a second state and the input state differs from the output state; and
a logic means, which is coupled to the buffer means, for setting the buffer means such that the input state of the applied data signal is provided as an output state at the output,
wherein the output is coupled to the data input and to the set input such that the output state provided is set only when an input state of the data signal and the output state differ from one another and the set signal changes to a prescribed state.

* * * * *

UNITED STATES PATENT AND TRADEMARK OFFICE
CERTIFICATE OF CORRECTION

PATENT NO. : 7,420,391 B2  Page 1 of 1
APPLICATION NO. : 11/612316
DATED : September 2, 2008
INVENTOR(S) : Alessandro Pesci It is certified that error appears in the above-identified patent and that said Letters Patent is hereby corrected as shown below:

In column 4, line 30 – delete "till," and insert -- t11, --.

In column 6, line 41 – after "level" insert -- 1. --.

In the Claims:

In Claim 22, column 14, line 36 – before "output" insert -- an --.

In Claim 22, column 14, line 38 – delete "second." and insert -- second, --.

Signed and Sealed this

Sixteenth Day of December, 2008

JON W. DUDAS
*Director of the United States Patent and Trademark Office*